(12) United States Patent
Chih-Kang

(10) Patent No.: US 6,905,026 B2
(45) Date of Patent: Jun. 14, 2005

(54) WAFER CARRYING SYSTEM

(76) Inventor: Chang Chih-Kang, 11Fl.-1, No. 19-2, Sanchung Rd., Nangang Chiu, Taipei (TW), 115

( * ) Notice: Subject to any disclaimer, the term of this patent is extended or adjusted under 35 U.S.C. 154(b) by 196 days.

(21) Appl. No.: 10/318,663

(22) Filed: Dec. 13, 2002

(65) Prior Publication Data

US 2004/0074807 A1 Apr. 22, 2004

(30) Foreign Application Priority Data

Oct. 22, 2002 (TW) .................................. 91216889 U

(51) Int. Cl.$^7$ .......................... B65D 85/30; B65D 85/86
(52) U.S. Cl. ....................................... 206/710; 206/832
(58) Field of Search .................................. 206/445, 710, 206/711, 832; 220/836, 844, 845, 846; 414/935, 937

(56) References Cited

U.S. PATENT DOCUMENTS

| | | | | |
|---|---|---|---|---|
| 5,711,427 A | * | 1/1998 | Nyseth ........................ | 206/710 |
| 5,915,562 A | * | 6/1999 | Nyseth et al. ............... | 206/710 |
| 6,105,782 A | * | 8/2000 | Fujimori et al. ............. | 206/710 |
| 6,457,598 B1 | * | 10/2002 | Hsieh et al. ................. | 220/323 |
| 6,622,883 B1 | * | 9/2003 | Wu et al. ..................... | 220/323 |

* cited by examiner

*Primary Examiner*—John A. Ricci
(74) *Attorney, Agent, or Firm*—Michael B. Fein; Brian L. Belles; Cozen O'Connor PC

(57) ABSTRACT

The purpose of the present invention is to provide a wafer carrying system with a manual-opened cover. The wafer carrying system of the present invention includes a wafer cassette having an opening, a cover disposed on the wafer cassette for covering the opening of the wafer cassette, an opener disposed on the cover for opening the cover, a base for mounting the opener thereon, a separating device connected with the base and the opener, thereby the cover being movable from a shut position to a separated position, a first pivoting device connected to the separating device for pivoting the cover to a first specific position, and a second pivoting device connected to the first pivoting device for pivoting the cover to a second specific position.

18 Claims, 10 Drawing Sheets

WAFER CARRYING SYSTEM

FIELD OF THE INVENTION

The present invention is related to a wafer carrying system and more particularly, to a wafer carrying system with a manual-opened cover.

BACKGROUND OF THE INVENTION

In the recent development of semiconductor fabrication technology, the continuous miniaturization in IC devices demands more stringent requirements in the fabrication environment and contamination control. It has been recognized that an inert mini-environment may be the only solution to future fabrication technologies when the device size is further reduced. In order to eliminate micro-contamination and to reduce native oxide growth on silicon surfaces, the wafer processing and the loading/unloading procedures of a process tool must be enclosed in an extremely high cleanliness mini-environment that is constantly flushed with ultrapure nitrogen that contains no oxygen or moisture. In order to maintain the high cleanliness class inside the process tool the loading and unloading sections of the process tool must be handled automatically by an input/output device such as a SMIF (standard mechanical interfaces) apparatus. A cassette of wafer can be transported into the process tool by a SMIF pod situated-on top of the SMIF apparatus.

Usually, wafer cassettes having sealing cover can be divided into two types, the mechanical-opened and the manual-opened. Wafer cassettes having mechanical-opened cover are always used in SMIF apparatus, and wafer cassettes having manual-opened cover are always used by means of maneuvering.

Please refer to FIGS. 1 and 2. They illustrate a wafer carrying system having manual-opened cover according to the prior art. The wafer carrying system includes a wafer cassette 10 and a cover 11. Meanwhile the wafer cassette 10 and the cover 11 have to be integrated via an opener, as shown in FIG. 2. The opener 20 includes two protrudent devices for engaging into two controlling troughs 12 of the cover 11, so as to rotate the two controlling troughs 12 to drive four tenons 13 thereof, thereby four tenons 13 being engaged into four troughs 14 and the combination of the wafer cassette 10 and the cover 11 finishing. Plural wafers 15 carried by said wafer cassette 10 are placed in an isolating region from the dust and the static electricity.

When separating the combination of the wafer cassette 10 and the cover 11, and opening the cover 11, an operator must use the opener 20. The operator pull a handle 21 of the opener 20 for rotating the two controlling troughs 12 to drive the four tenons 13. Then the cover 11 can be opened, but the operator has to take away the cover 11 with the opener 20 and find some space to place the cover 11 with the opener 20. After wafer 15 is taken out from the wafer cassette 10, the operator takes the cover 11 with the opener 20 to execute the above steps for combining the wafer cassette 10 and the cover 11 to close. It is not convenient to execute such complicated steps and provide extra space for placing the cover 11 with the opener 20. The wafer carrying system is therefore of limited use.

Therefore, it is tried to rectify those drawbacks and provide a wafer cassette with a manual-opened cover by the present applicant.

SUMMARY OF THE INVENTION

It is therefore a primary objective of the present invention to provide a wafer carrying system with a manual-opened cover, which can be operated easily.

According to the present invention, the wafer carrying system includes a wafer cassette having an opening, a cover disposed on the wafer cassette for covering the opening of the wafer cassette, an opener disposed on the cover for opening the cover, a base for mounting the opener thereon, a separating device connected with the base and the opener, thereby the cover being movable from a shut position to a separated position, a first pivoting device connected to the separating device for pivoting the cover to a first specific position, and a second pivoting device connected to the first pivoting device for pivoting the cover to a second specific position.

Certainly, the separating device can be a movable shaft, and the base further comprises a carrying device for carrying the movable shaft.

Certainly, the movable shaft can be movable on the carrying device for moving the cover between the shut position and the separated position.

Preferably, the carrying device further includes a rotatable disc connected to the movable shaft for moving the movable shaft.

Preferably, the carrying device further includes an arc recess for facilitating a movement of the movable shaft.

Preferably, the separating device further includes a positioning device for positioning the first pivoting device on the separating device.

Preferably, the cover rotates 90° from the separated position to the first position.

Preferably, the second pivoting device further includes an engaging shaft engaging with the first pivoting device for rotating the second pivoting device on the first pivoting device.

Preferably, the cover rotates 90° from the first position to the second position.

Preferably, the opener further includes a "n"-shaped handle for operating the opener more easily.

Certainly, the opener can be moved on the base via the separating device.

According to the present invention, the wafer carrying system includes a wafer cassette having an opening, a cover disposed on the wafer cassette for covering the opening of the wafer cassette, an opener disposed on the cover for opening the cover, a base for mounting the opener thereon, a separating device connected with the base and the opener, thereby the cover being movable from a shut position to a separated position, and a first pivoting device connected to the separating device for pivoting the cover to a first specific position.

Preferably, the wafer carrying system further includes a second pivoting device connected to the first pivoting device for pivoting the cover to a second specific position.

According to the present invention, the wafer carrying system includes a wafer cassette having an opening, a cover disposed on the wafer cassette for covering the opening of the wafer cassette, an opener disposed on the cover for opening the cover, a base for mounting the opener thereon, and a separating device connected with the base and the opener, thereby the cover being moved from a shut position to a separated position.

Preferably, the wafer carrying system further includes a first pivoting device connected to the separating device for pivoting the cover to a first specific position.

According to the present invention, the wafer carrying system includes a wafer cassette having an opening, a cover disposed on the wafer cassette for covering the opening of the wafer cassette, an opener disposed on the cover for opening the cover, and a separating device connected with the opener, thereby the cover being movable from a shut position to a separated position.

Preferably, the wafer carrying system further includes a base connected with the separating device for mounting the opener thereon.

According to the present invention, the wafer carrying system includes a wafer cassette having an opening, a cover disposed on the wafer cassette for covering the opening of the wafer cassette, an opener disposed on the cover for opening the cover; wherein the cover is movable from a shut position to a separated position.

Preferably, the wafer carrying system further includes a separating device connected with the opener for moving the opener, thereby the cover being movable from the shut position to the separated position.

The foregoing and other features and advantages of the present invention will be more clearly understood through the following descriptions with reference to the drawings, wherein:

DETAILED DESCRIPTION OF THE PREFERRED EMBODIMENTS

Figure 1:
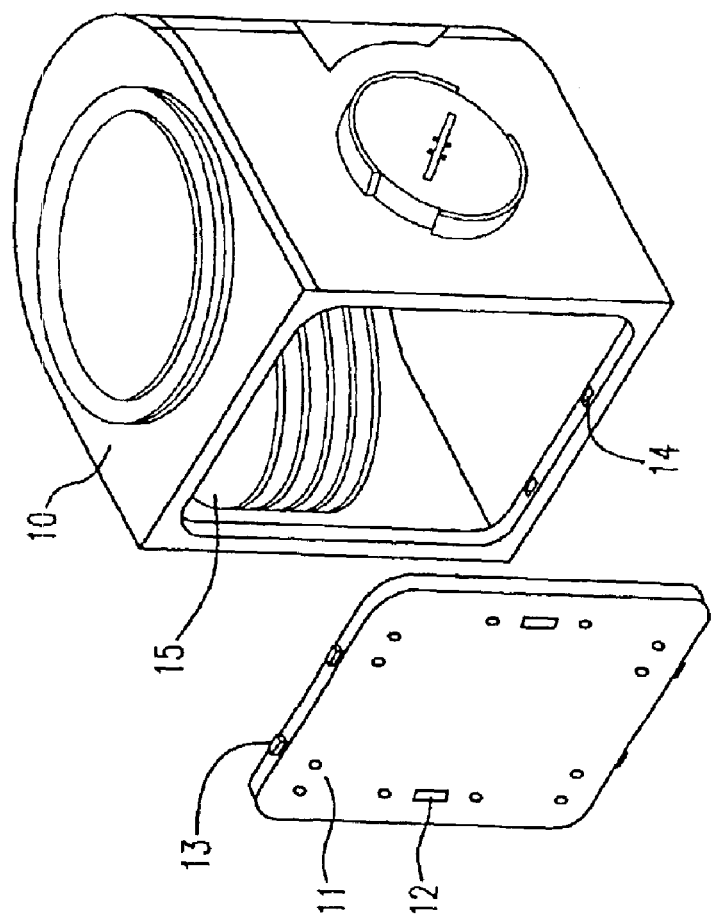
FIG. 1 illustrates a wafer carrying system with a cover according to the prior art.
Figure 2:
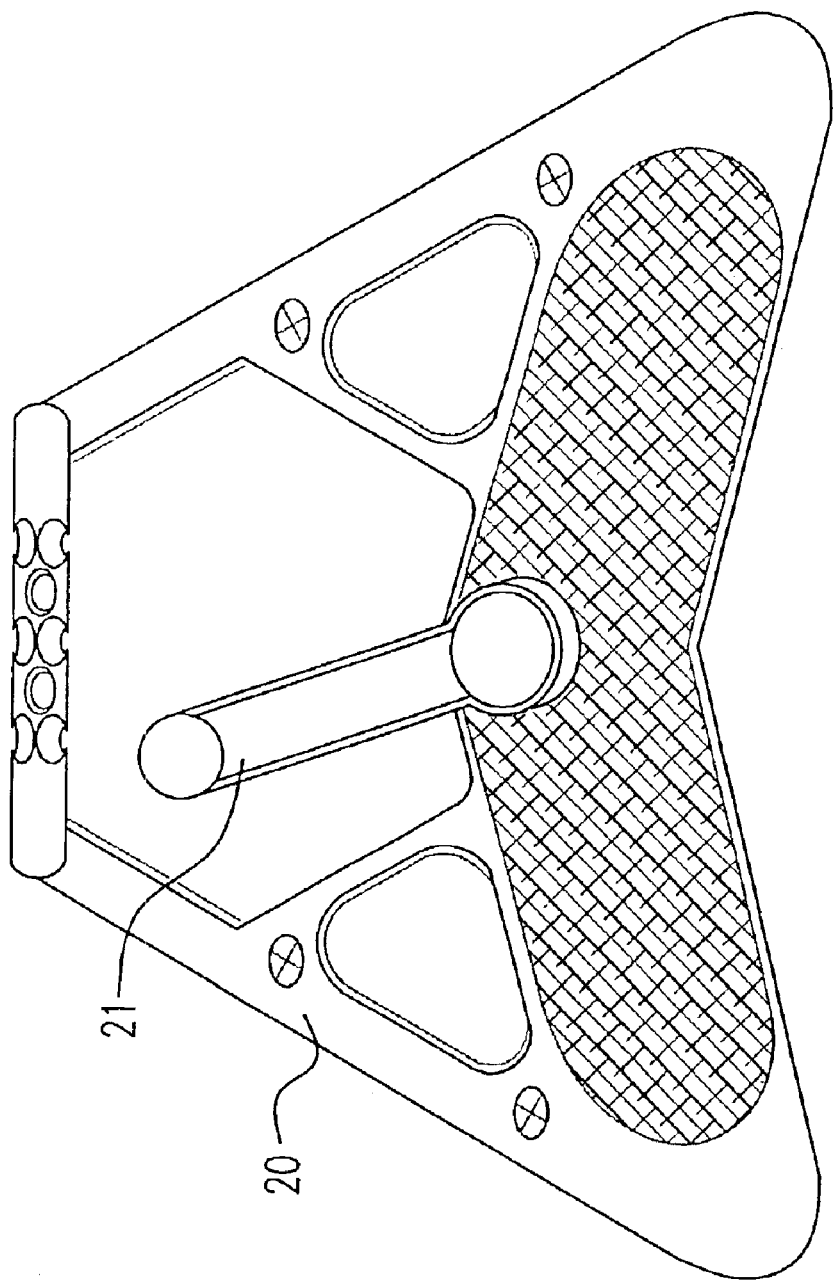
FIG. 2 illustrates an opener for opening the cover of the wafer carrying system of FIG. 1.

Please refer to FIGS. 3–7. They illustrate a wafer carrying system with a manual-opened cover according to the present invention. The wafer carrying system includes a wafer cassette 30 having an opening 301, a cover 31 disposed on the wafer cassette 30 for covering the opening of the wafer cassette 30, an opener 32 disposed on the cover 31 for opening the cover 31, a base 33 for mounting the opener 32 thereon, a separating device 34 connected with the base 33 and the opener 32, thereby the cover being movable from a shut position 35 (shown in FIG. 3) to a separated position 40 (shown in FIG. 4), a first pivoting device 50 connected to the separating device 34 for pivoting the cover 31 to a first specific position 60, and a second pivoting device 51 connected to the first pivoting device 50 for pivoting the cover 31 to a second specific position 70.

Figure 3:
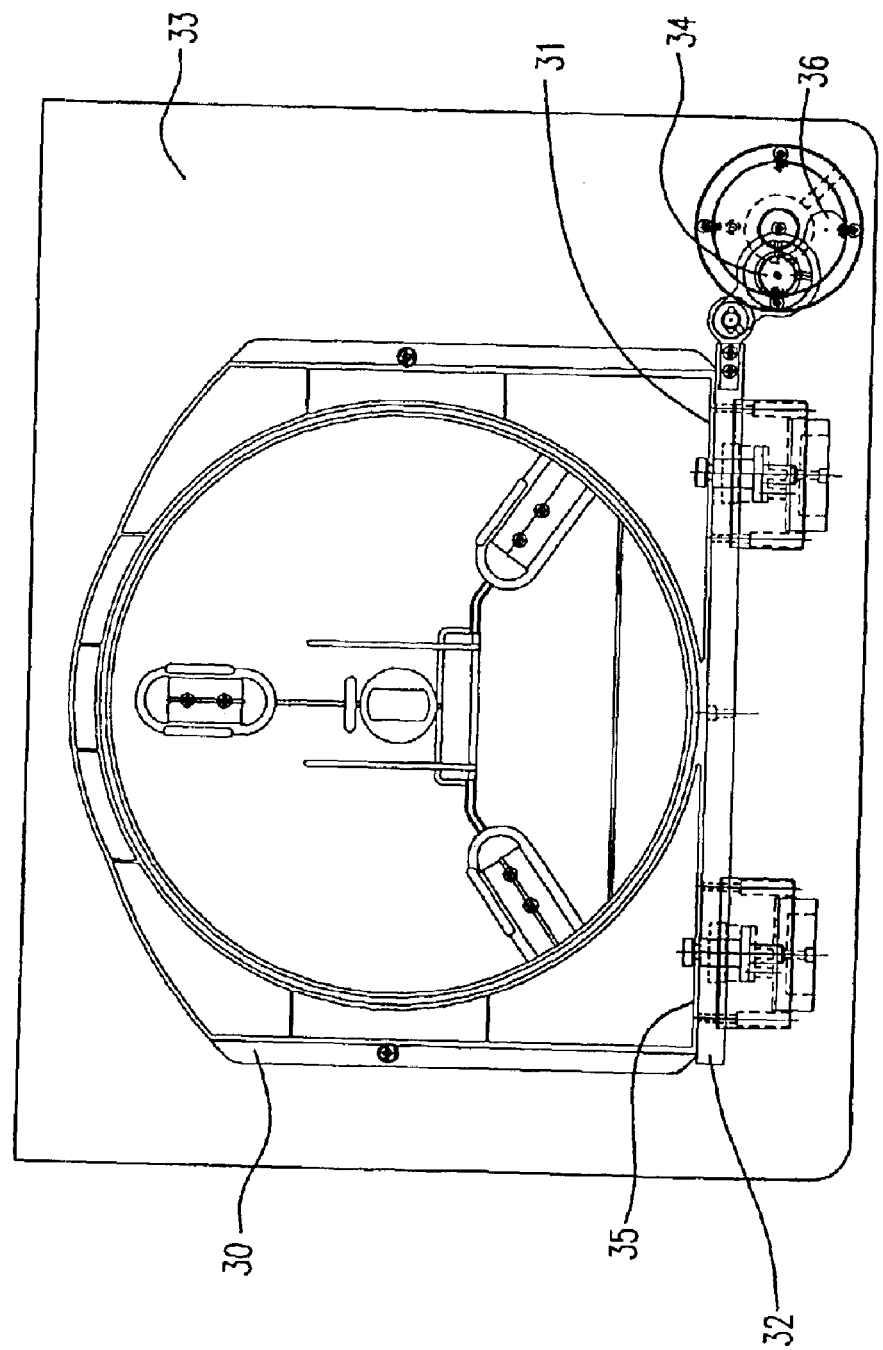
FIG. 3 illustrates a first embodiment of a wafer carrying system according to the present invention.
Figure 4:
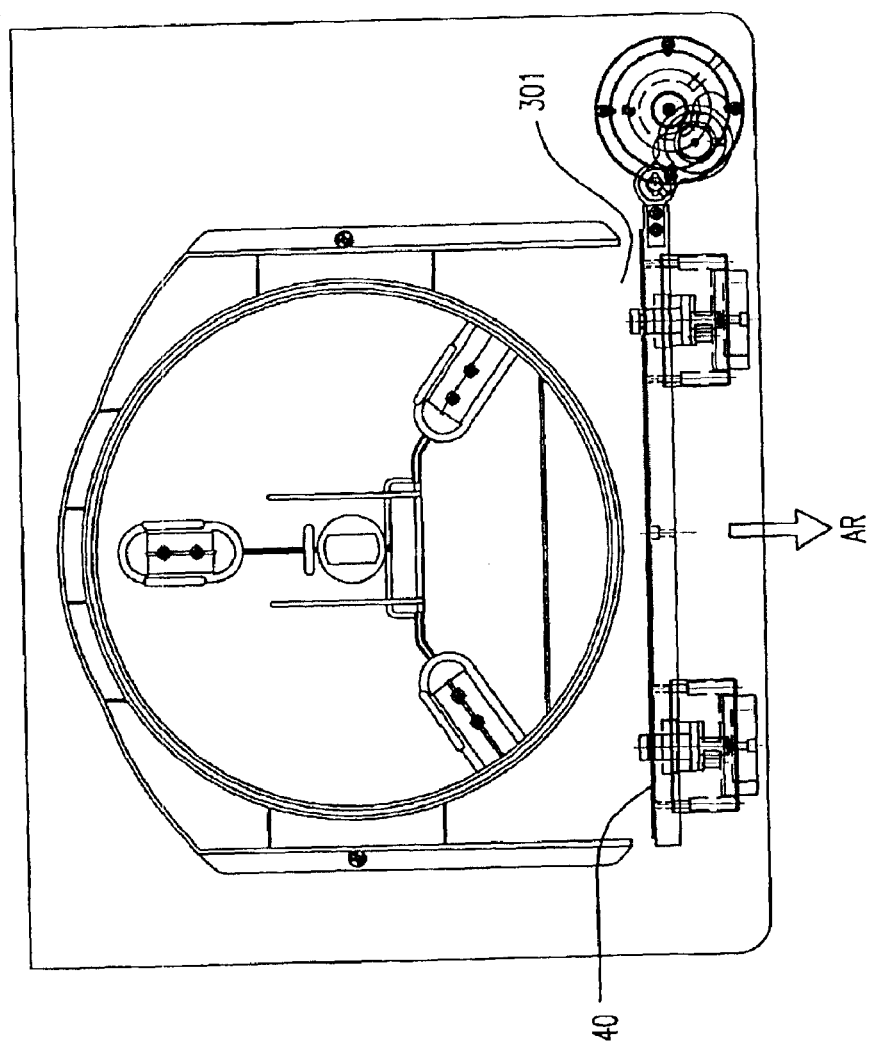
FIG. 4 illustrates the cover moved to the separated position according to the present invention.
Figure 5:
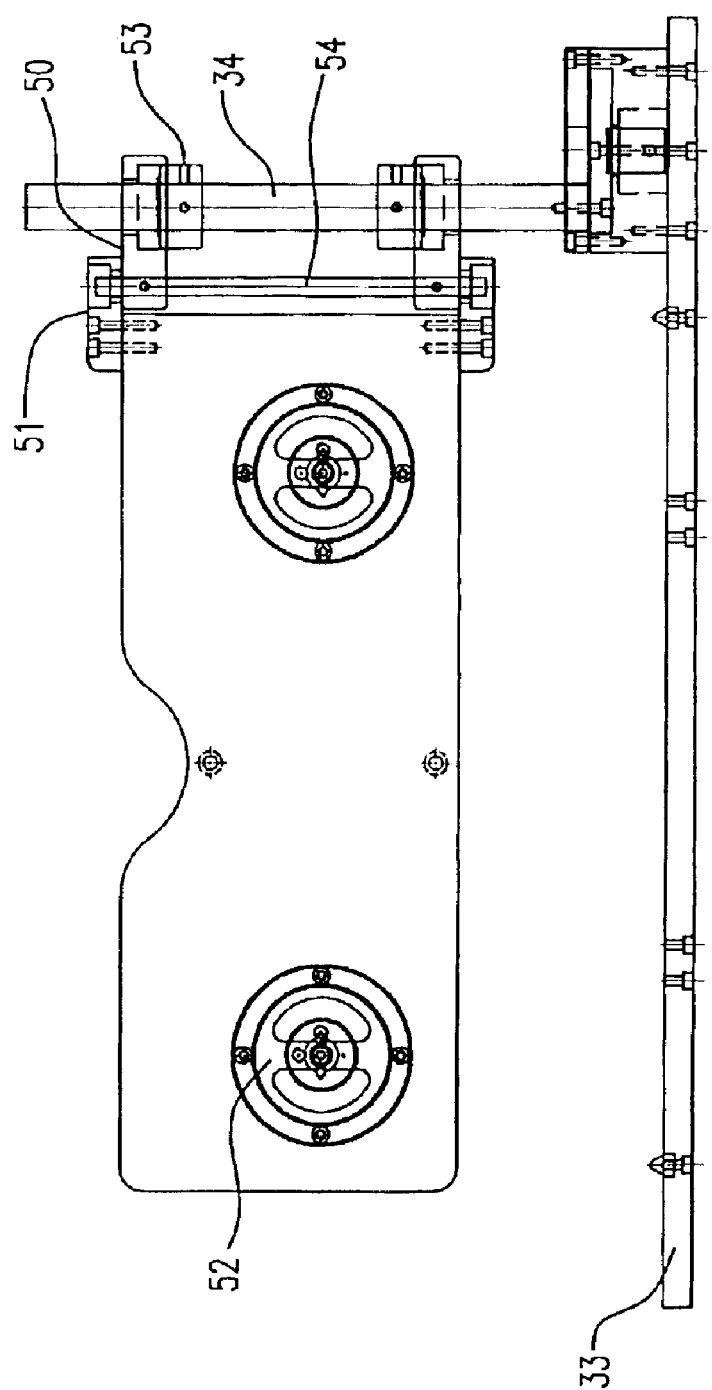
FIG. 5 illustrates a front view of the first pivoting device and the opener of FIG. 1.
Figure 6:
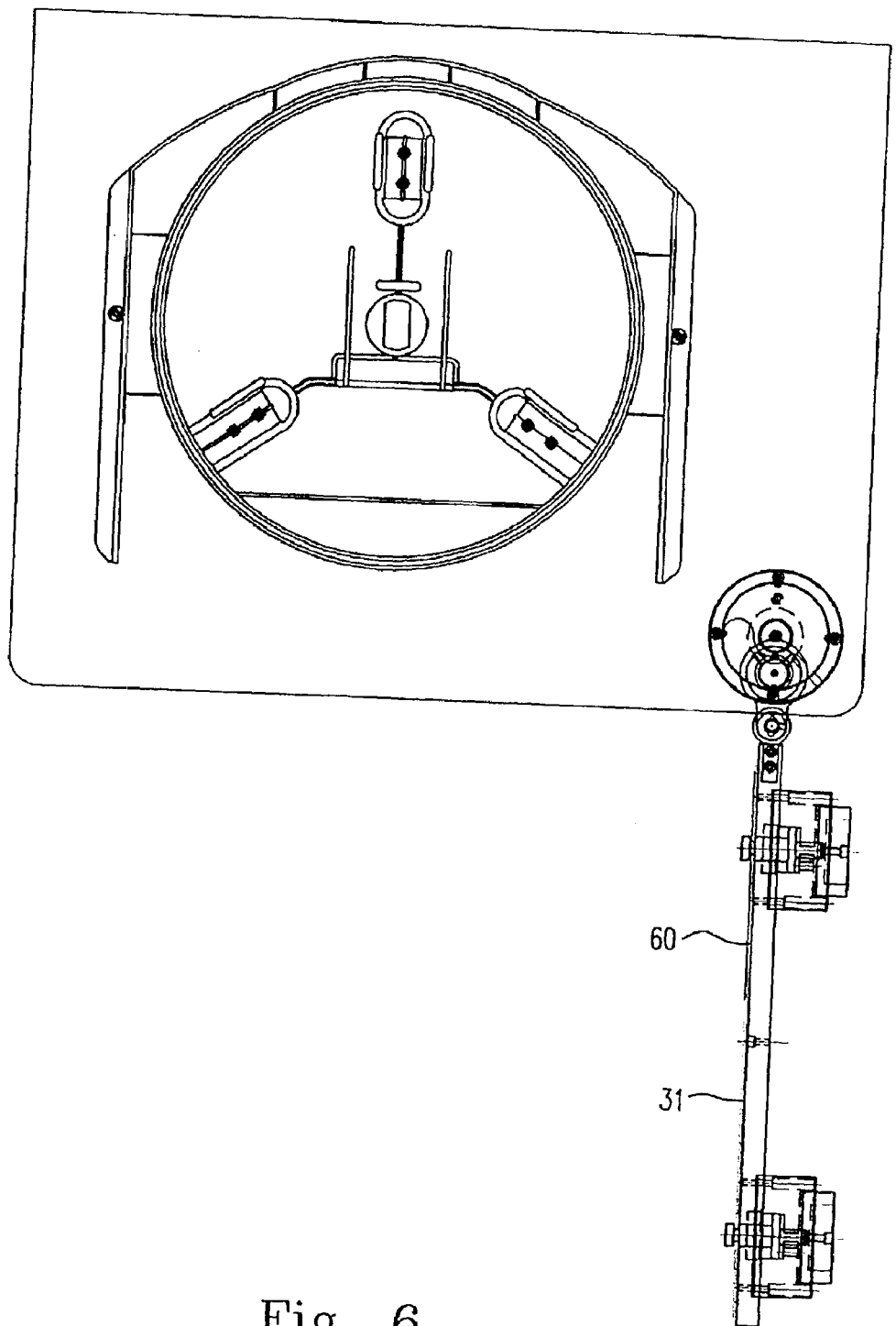
FIG. 6 illustrates the cover pivoted to the first pivoting position via the first pivoting device according to the present invention.
Figure 7:
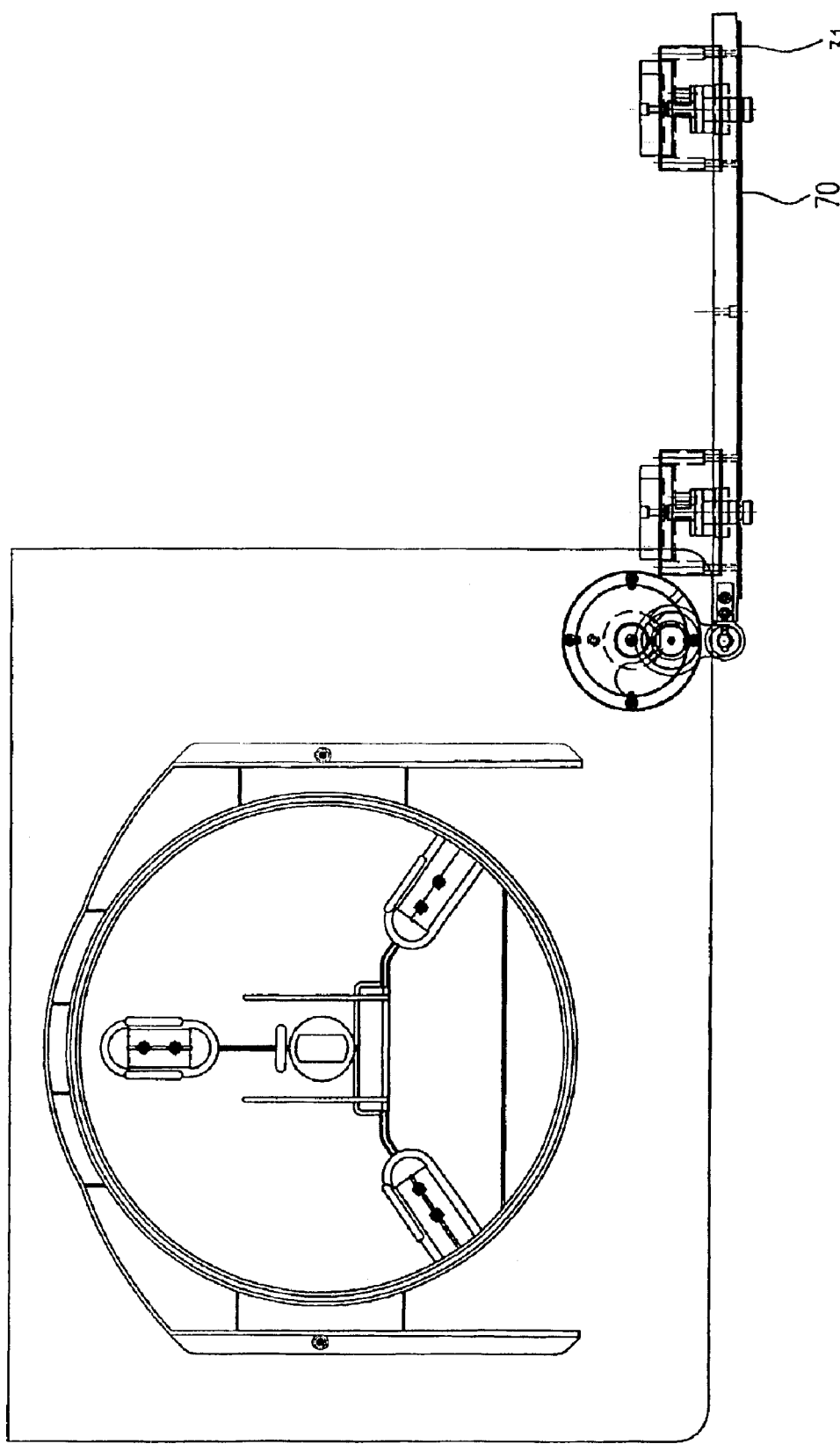
FIG. 7 illustrates the cover pivoted to the second pivoting position via the second pivoting device according to the present invention.
Figure 8:
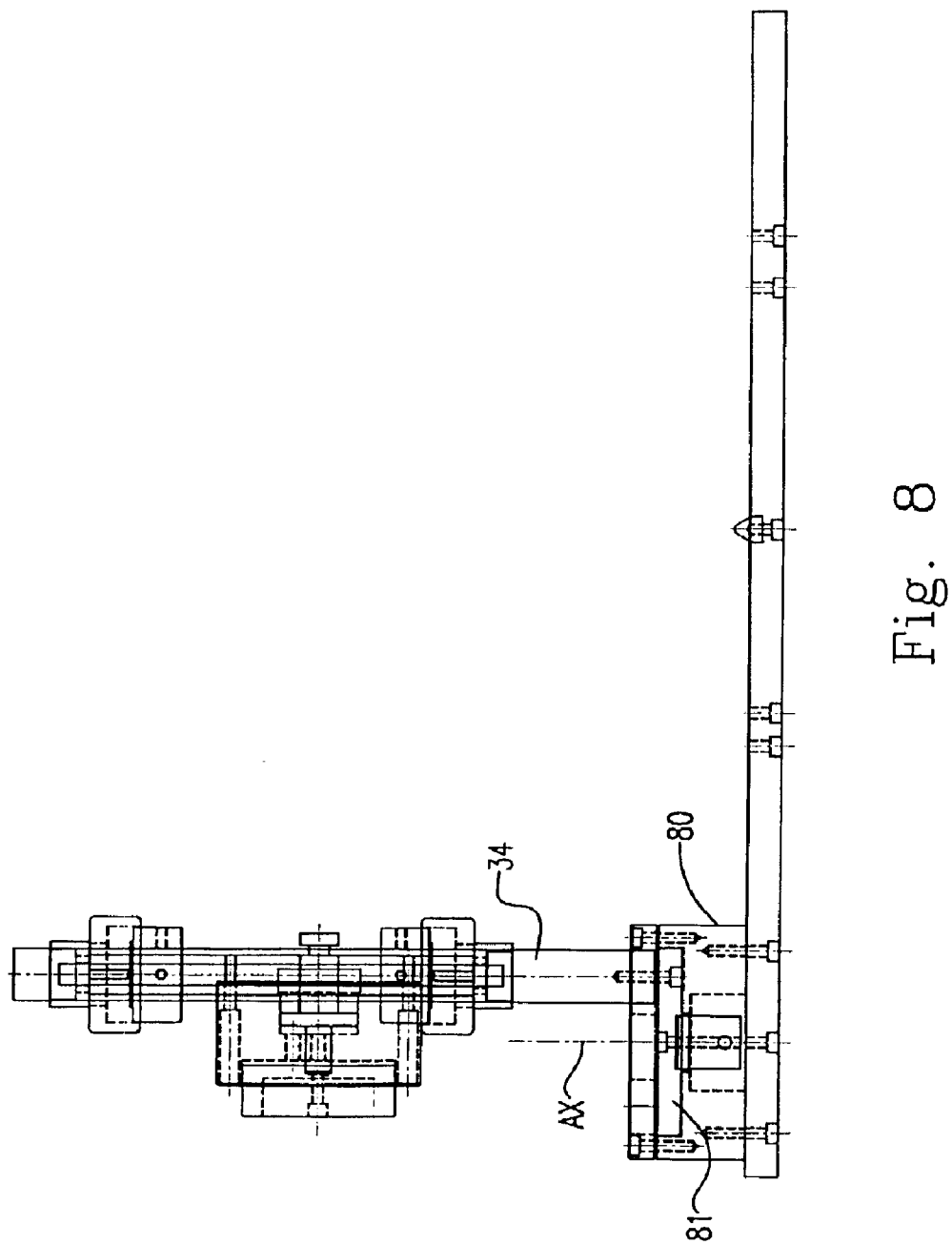
FIG. 8 illustrates a lateral view of the movable shaft and the base according to the present invention.

In FIG. 5, it illustrates a switch 52 of the opener 32 of the FIG. 3 for controlling the cover 31, thereby the cover 31 being separated to the separated position 40 via the opener 32 and the raw wafers being taken in the direction AR (shown in FIG. 4). The separating device 34 is a movable shaft, and the base 33 further comprises a carrying device 80 for carrying the movable shaft 34. Certainly, the movable shaft 34 can be movable on the carrying device 80 for moving the cover 31 between the shut position 35 and the separated position 40. Preferably, the carrying device 80 further includes a rotatable disc 81 connected to the movable shaft 34 for moving the movable shaft 34. Additionally, the carrying device 80 could include an arc recess 36 for facilitating a movement of the movable shaft 34.

Figure 9:
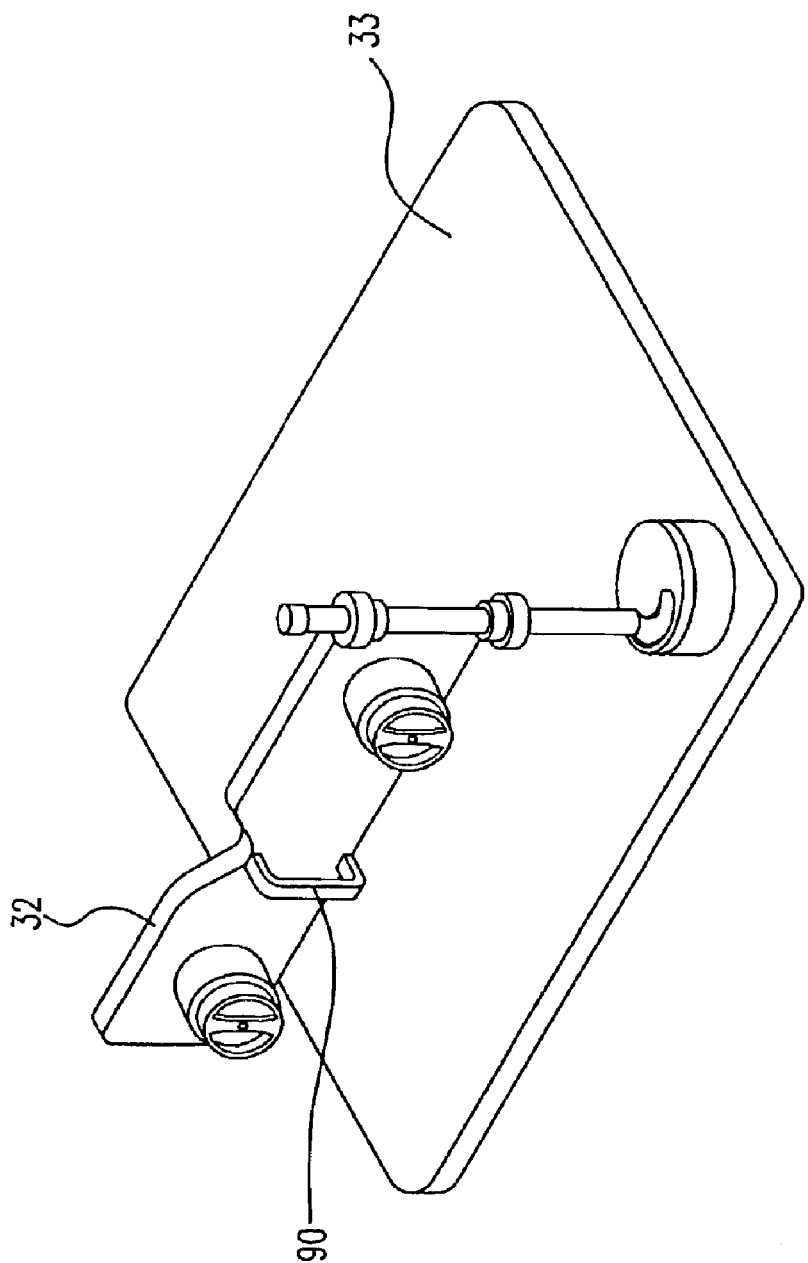
FIG. 9 illustrates a stereopicture of the opener and the base according to the present invention.

In the embodiment of the present invention, the separating device 34 further includes a positioning device 53 for positioning the first pivoting device 50 on the separating device 34, wherein the cover 31 could rotate 90° from the separated position 40 to the first position 60. The second pivoting device 51 further includes an engaging shaft 54 engaging with the first pivoting device 50 for rotating the second pivoting device 51 on the first pivoting device 50, wherein the cover 31 could rotate 90° from the first position 60 to the second position 70. Please refer to FIG. 9. For being operated more easily, the opener 32 disposed on the base 33 further includes a "n"-shaped handle 90. The opener 32 can be moved on the base 33 via the separating device 34. FIG. 9 illustrates how the opener 32 is disposed on the base 33.

Figure 10:
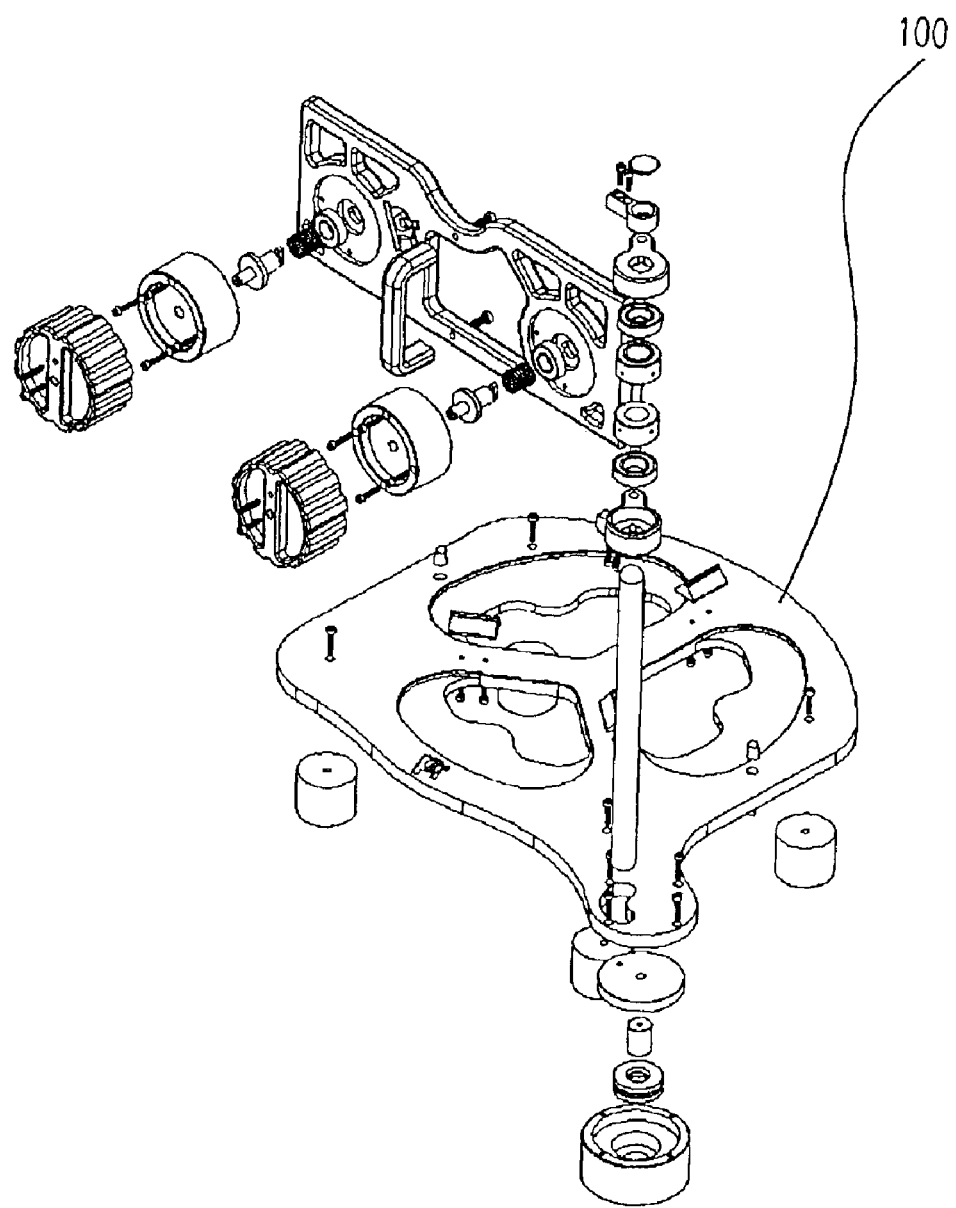
FIG. 10 illustrates another embodiment of the wafer carrying system according to the present invention.

The wafer carrying system of the present invention could be simplified. The wafer carrying system includes a wafer cassette 30 having an opening 301, a cover 31 disposed on the wafer cassette 30 for covering the opening 301 of the wafer cassette 30, an opener 32 disposed on the cover 31 for opening the cover 31, a base 33 for mounting the opener 32 thereon, a separating device 34 connected with the base 33 and the opener 32, thereby the cover 31 being movable from a shut position 35 to a separated position 40, and a first pivoting device 51 connected to the separating device 34 for pivoting the cover 31 to a first specific position 60. Certainly, the wafer carrying system could further include a second pivoting device 51 connected to the first pivoting device 50 for pivoting the cover 31 to a second specific position 70. Furthermore, the base 33 of FIG. 9 could be changed into arc-shaped base 100, shown in FIG. 10.

Similarly, the wafer carrying system of the present invention could be also simplified as a wafer carrying system including a wafer cassette 30 having an opening 301, a cover 31 disposed on the wafer cassette 30 for covering the opening 301 of the wafer cassette 30, an opener 32 disposed on the cover 31 for opening the cover 31, a base 33 for mounting the opener 32 thereon, and a separating device 34 connected with the base 33 and the opener 32, thereby the cover 31 being movable from a shut position 35 to a separated position 40.

According to the present invention, the wafer carrying system could be also simplified as a wafer carrying system including a wafer cassette 30 having an opening 301, a cover 31 disposed on the wafer cassette 30 for covering the opening 301 of the wafer cassette 30, an opener 32 disposed on the cover 31 for opening the cover 31, and a separating device 34 connected with the base 33 and the opener 32, thereby the cover 31 being movable from a shut position 35 to a separated position 40.

While the invention has been described in terms of what are presently considered to be the most practical and preferred embodiments, it is to be understood that the invention need not to be limited to the disclosed embodiment. On the contrary, it is intended to cover various modifications and similar arrangements included within the spirit and scope of the appended claims, which are to be accorded with the broadest interpretation so as to encompass all such modifications and similar structures.

What is claimed is:

1. A wafer carrying system comprising:
   a wafer cassette having an opening;
   a cover disposed on said wafer cassette for covering said opening of said wafer cassette;
   an opener disposed on said cover for opening said cover;
   a base for mounting said opener thereon;
   a separating device connected with said base and said opener, thereby said cover being movable from a shut position to a separated position;
   a first pivoting device connected to said separating device for pivoting said cover to a first specific position; and
   a second pivoting device connected to said first pivoting davice for pivoting said cover to a second specific position.

2. The wafer carrying system according to claim 1, wherein said separating device is a movable shaft, and said base further comprises a carrying device for carrying said movable shaft.

3. The wafer carrying system according to claim 2, wherein said movable shaft is movable on said carrying device for moving said cover between said shut position and said separated position.

4. The wafer carrying system according to claim 3, wherein said carrying device further comprises a rotatable disc connected to said movable shaft for moving said movable shaft.

5. The wafer carrying system according to claim 3, wherein said carrying device further comprises an arc recess for facilitating a movement of said movable shaft.

6. The wafer carrying system according to claim 1, wherein said separating device further comprises a positioning device for positioning said first pivoting device on said separating device.

7. The wafer carrying system according to claim 6, wherein said cover rotates 90° from said separated position to said first position.

8. The wafer carrying system according to claim 7, wherein said second pivoting device further comprises an engaging shaft engaging with said first pivoting device for rotating said second pivoting device on said first pivoting device.

9. The wafer carrying system according to claim 8, wherein said cover rotates 90° from said first position to said second position.

10. The wafer carrying system according to claim 1, wherein said opener further comprises a "n"-shaped handle for operating said opener more easily.

11. The wafer carrying system according to claim 1, wherein said opener is moved on said base via said separating device.

12. A wafer carrying system comprising:
    a wafer cassette having an opening;
    a cover disposed on said wafer cassette for covering said opening of said wafer cassette;
    an opener disposed on said cover for opening said cover;
    a base for mounting said opener thereon;
    a separating device connected with said base and said opener, thereby said cover being movable from a shut position to a separated position; and
    a first pivoting device connected to said separating device for pivoting said cover to a first specific position.

13. The wafer carrying system according to claim 12 further comprising a second pivoting device connected to said first pivoting device for pivoting said cover to a second specific position.

14. A wafer carrying system comprising:
    a wafer cassette having an opening;
    a cover disposed on said wafer cassette for covering said opening of said wafer cassette;
    an opener disposed on said cover for opening said cover;
    a base for mounting said opener thereon; and
    a separating device connected with said base and said opener, thereby said cover being moved from a shut position to a separated position.

15. The wafer carrying system according to claim 14 further comprising a first pivoting device connected to said separating device for pivoting said cover to a first specific position.

16. A wafer carrying system comprising:
    a wafer cassette having an opening;
    a cover disposed on said wafer cassette for covering said opening of said wafer cassette;
    an opener disposed on said cover for opening said cover; and
    a separating device connected with said opener, thereby said cover being movable from a shut position to a separated position.

17. The wafer carrying system according to claim 16 further comprising a base connected with said separating device for mounting said opener thereon.

18. A wafer carrying system comprising:
    a wafer cassette having an opening;
    a cover disposed on said wafer cassette for covering said opening of said wafer cassette;
    an opener disposed on said cover for opening said cover, wherein said cover is movable from a shut position to a separated position; and
    a separating device connected with said opener for moving said opener, thereby said cover being moved from said shut position to said separated position.

* * * * *